United States Patent
Golla et al.

(10) Patent No.: US 7,268,019 B2
(45) Date of Patent: Sep. 11, 2007

(54) METHOD AND APPARATUS FOR HIGH TEMPERATURE OPERATION OF ELECTRONICS

(75) Inventors: Christopher Golla, Houston, TX (US); Roger L. Schultz, Aubrey, TX (US); James Masino, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 184 days.

(21) Appl. No.: 10/946,813

(22) Filed: Sep. 22, 2004

(65) Prior Publication Data

US 2006/0060964 A1 Mar. 23, 2006

(51) Int. Cl.
*H01L 21/00* (2006.01)
*H01L 23/34* (2006.01)

(52) U.S. Cl. ............... 438/122; 257/713; 257/E23.082; 257/E23.085; 257/E23.499

(58) Field of Classification Search ................ 438/122; 257/713
See application file for complete search history.

(56) References Cited

U.S. PATENT DOCUMENTS

| | | | |
|---|---|---|---|
| 4,602,314 A | 7/1986 | Broadbent | 361/386 |
| 4,926,227 A | 5/1990 | Jensen | 357/28 |
| 5,079,618 A | 1/1992 | Farnworth | 357/81 |
| 5,206,792 A | 4/1993 | Reynolds | 361/386 |
| 5,229,327 A | 7/1993 | Farnworth | 437/209 |
| 5,569,950 A | 10/1996 | Lewis et al. | 257/467 |
| 5,637,921 A | 6/1997 | Burward-Hoy | 257/712 |
| 5,646,828 A | 7/1997 | Degani et al. | 361/715 |
| 5,891,755 A | 4/1999 | Edwards et al. | 438/108 |
| 5,986,885 A | 11/1999 | Wyland | 361/704 |
| 6,037,658 A | 3/2000 | Brodsky et al. | 257/707 |
| 6,127,724 A | 10/2000 | DiStefano | 257/675 |
| 6,208,056 B1 | 3/2001 | Perkins | 310/179 |
| 6,246,115 B1 | 6/2001 | Tang et al. | 257/706 |
| 6,404,048 B2 | 6/2002 | Akram | 257/706 |
| 6,476,483 B1 | 11/2002 | Adler et al. | 257/713 |
| 6,523,362 B2 | 2/2003 | Binz et al. | 62/259.2 |
| 6,559,538 B1 | 5/2003 | Pomerene et al. | 257/712 |
| 6,586,835 B1 | 7/2003 | Ahn et al. | 257/717 |
| 6,631,078 B2 | 10/2003 | Alcoe et al. | 361/719 |
| 6,667,451 B1 | 12/2003 | Hart | 200/314 |
| 6,833,993 B2 * | 12/2004 | Wang | 361/704 |
| 2001/0035577 A1 | 11/2001 | Akram | 257/706 |
| 2002/0063327 A1 | 5/2002 | Chu et al. | 257/706 |
| 2002/0070445 A1 | 6/2002 | Tarter | 257/714 |

(Continued)

FOREIGN PATENT DOCUMENTS

JP 01295449 11/1989

(Continued)

*Primary Examiner*—David A. Zarneke
(74) *Attorney, Agent, or Firm*—Baker Botts L.L.P.

(57) ABSTRACT

Embodiments of methods and apparatus for high temperature operation of electronics according to the invention are disclosed. One embodiment of the invention generally includes an integrated circuit package having a substrate. A plurality of integrated circuits are coupled to a surface of the substrate. A lid is positioned above the substrate facing the surface. One or more pieces of compliant and thermally conductive material are compressed between at least one of the integrated circuits and the lid. The lid defines in part an enclosed volume containing the compliant and thermally conductive material.

22 Claims, 6 Drawing Sheets

U.S. PATENT DOCUMENTS

| | | | |
|---|---|---|---|
| 2002/0105071 A1 | 8/2002 | Mahajan et al. | 257/720 |
| 2002/0109226 A1 | 8/2002 | Khan et al. | 257/737 |
| 2003/0209802 A1 | 11/2003 | Awano | 257/712 |
| 2003/0227751 A1 | 12/2003 | Wang | 361/719 |
| 2003/0232463 A1 | 12/2003 | Davidson | 438/122 |
| 2004/0017661 A1 | 1/2004 | Siegel | 361/705 |
| 2004/0039254 A1 | 2/2004 | Stivoric et al. | 600/300 |
| 2004/0042175 A1 | 3/2004 | Kehret et al. | 361/690 |
| 2004/0046249 A1 | 3/2004 | Bhattacharya et al. | 257/712 |

FOREIGN PATENT DOCUMENTS

| | | |
|---|---|---|
| JP | 02142170 | 5/1990 |
| JP | 02143548 | 6/1990 |

\* cited by examiner

METHOD AND APPARATUS FOR HIGH TEMPERATURE OPERATION OF ELECTRONICS

BACKGROUND

The present invention relates to the field of electronic devices. In particular, the invention relates to a method and apparatus for high temperature operation of electronics.

The temperature levels at which electronic devices operate without error can be affected by the material of which the device is formed as well as the type of circuit. For example, a circuit formed by a bulk CMOS process may not be capable of operating without error at the same ambient temperature and heat dissipation conditions as the same circuit implemented in a silicon on sapphire (SOS) process. In addition, one bulk CMOS circuit may perform adequately at a higher temperature than another bulk CMOS circuit if the second circuit converts a greater amount of input electrical power into heat. For error-free operation of the circuits at a particular ambient temperature, the second circuit may require additional mechanisms for moving heat away from the circuit.

One example of an environment in which operation of electronic devices can be affected by temperature is downhole in a well. For example, sensors used in a well can include electronics performing the functions of receiving, processing, and storing information about the parameters being sensed. Temperature-related errors in electronics operation can reduce the ability of a downhole tool to perform adequately.

DETAILED DESCRIPTION

Figure 1:
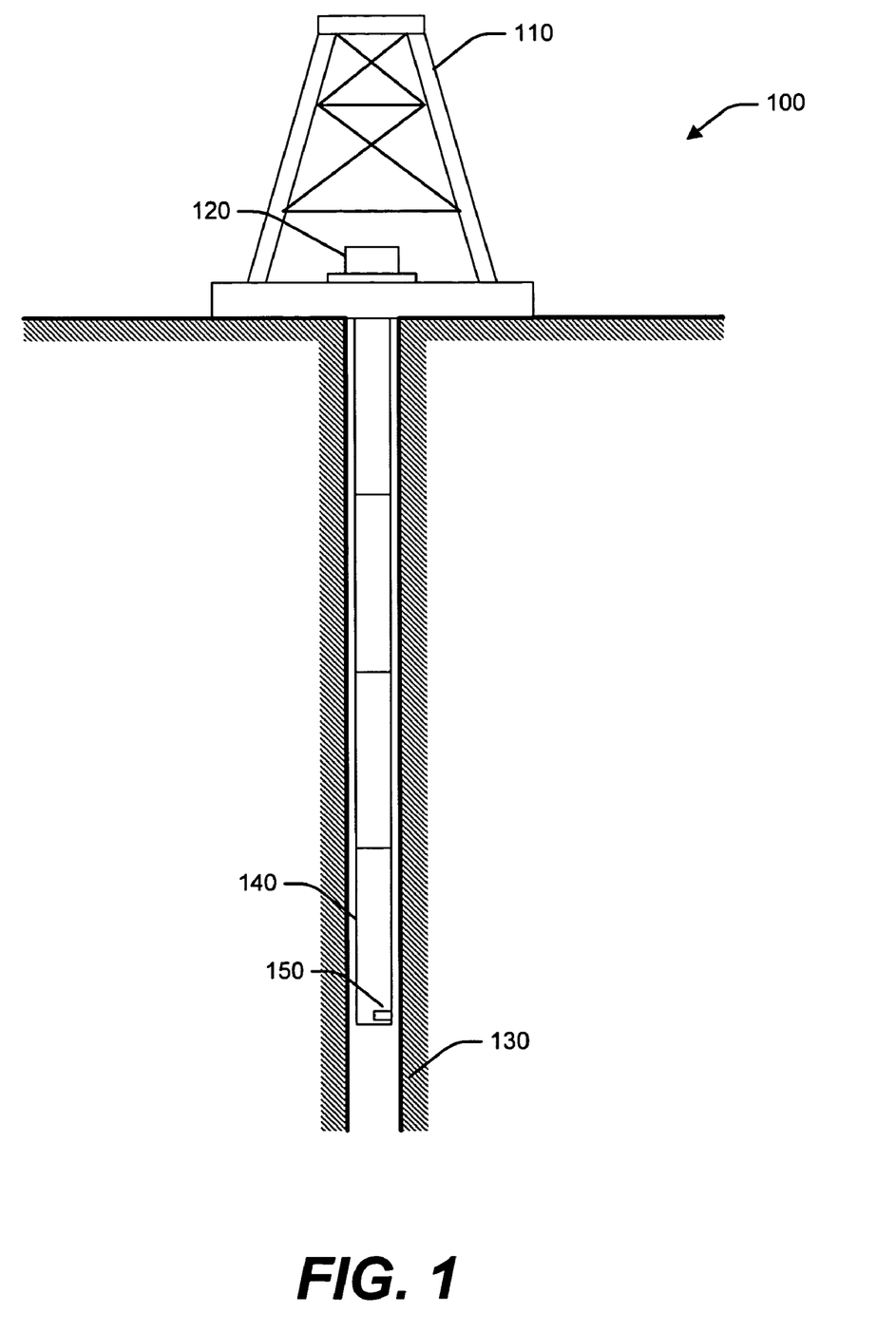
FIG. 1 is a diagram of a wellbore in which one embodiment of the invention for high temperature operation of electronics can be utilized.

A well 100 in which one embodiment of the invention for high temperature operation of electronics can be utilized is illustrated in FIG. 1. While the well is shown for a vertical land well for petroleum products, the invention can also be used in other environments for high temperature operation of electronics. For example, the system can be used in a land well that deviates from vertical toward a horizontal orientation. As another example, the system can be used in a subsea well that is either vertical or deviates toward horizontal. Support structure 110 is connected to a pipe 140 by surface equipment 120. The pipe 140 extends downhole into the wellbore 130. A device 150 in which electronics can be operated at high temperature is disposed in the pipe. The device 150 can also be disposed downhole by means of other support structures including a wireline, coiled tubing, and drill pipe during drilling. One example of a device 150 is a downhole tool 150.

A device 150 lowered into a well can experience ambient temperatures above the temperature at which its electronics are capable of operating. In one embodiment, different electronics in the device have different maximum operating temperatures. The ambient temperature experienced by device 150 in a well can be above the maximum operating temperature of one set of integrated circuits while still being below the maximum operating temperature of another set of integrated circuits.

Various active coolers are known in the art for maintaining a local temperature below the ambient temperature. For example, a peltier-type cooler utilizes a junction of two dissimilar metals carrying a small amount of current to evolve heat on one side while absorbing heat on the other side. The cold side of the peltier-type cooler maintains a local temperature below ambient. Another active cooler provides a flow of fluid (for example water) that has a temperature below ambient. Such fluid can be directed, in one embodiment, through channels in a lid of an integrated circuit package. Passive coolers are also known in the art for dissipating heat generated by an electronic circuit. For example, a thermal heat sink and fan combination can be used to move heat generated by an integrated circuit away from that integrated circuit. Another example of passive cooling is the use of eutectic material. A passive cooler reduces the extent to which the local temperature of an integrated circuit exceeds ambient temperature, but does not produce a local temperature below ambient temperature. Both active and passive coolers can be thermally coupled to a location from which heat is to be dissipated. One device for thermally coupling a cooler is a heat pipe filled with a working fluid.

Figure 2:
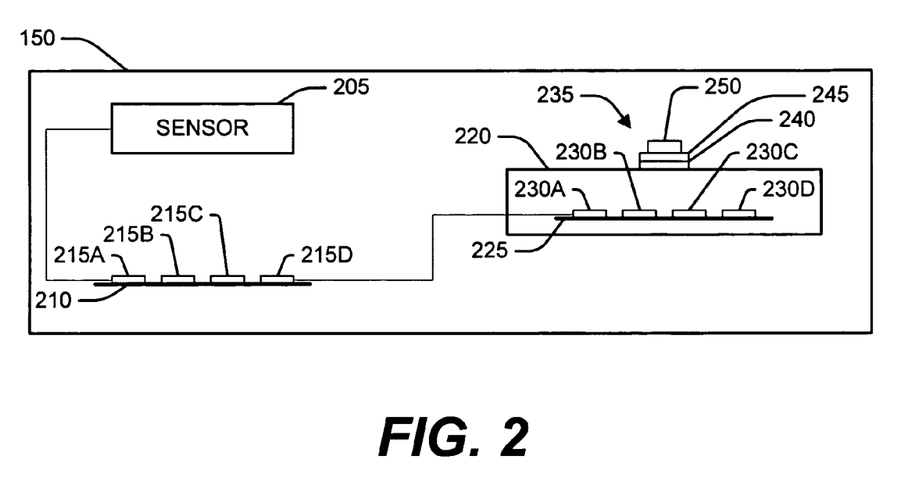
FIG. 2 is a block diagram of a downhole tool utilizing one embodiment of the invention for high temperature operation of electronics.

FIG. 2 is a block diagram of the downhole tool 150 utilizing one embodiment of the invention for high temperature operation of electronics. The downhole tool 150 may include a sensor 205. For example, the sensor 205 can detect variations in fluid pressure or the strength of the magnetic field along a particular axis. In one embodiment, the sensor 205 produces digital information corresponding to particular parameters, for example magnetic field strength waveforms. The sensor 205 is coupled to an integrated circuit 215A mounted on a substrate 210 and can transmit digital information over that link. In one embodiment, the substrate 210 is ceramic and includes embedded traces that connect the integrated circuits 215A-D that are mounted thereon. The substrate 210 may also include multiple layers to increase the flexibility connecting traces. An integrated circuit 215A may be electrically coupled to the substrate 210 by touching conductive pads on the circuit 215A to bond wires on the surface of the substrate 210. The combination of substrate 210 and integrated circuits 215A-D, in one embodiment, is housed inside a metallic or ceramic package that is evacuated and hermetically sealed. Such a package may be referred to as a Multi-Chip-Module (MCM). An integrated circuit 215A may include a die as well as exterior areas used to electrically couple the circuitry in the die to other electronic devices.

The integrated circuits 215A-D are not actively cooled and are capable of operating at least at the ambient temperature of the downhole tool. For example, integrated circuits 215A-D may include one or more processors that have a maximum operating temperature above the ambient temperature of the downhole location. As another example, the circuits 215A-D may be formed of particular materials such as silicon-on-sapphire (SOS) or silicon-on-insulator (SOI) that have higher maximum operating temperatures than other materials such as bulk CMOS.

One of the substrate 210 mounted integrated circuits 215D is coupled to an integrated circuit 230A mounted on substrate 225. That connection may be used to transmit or receive digital information produced by the sensor 205. The integrated circuits 230A-D mounted on substrate 225 are enclosed in package 220. An active cooler 235 is attached to package 220 to reduce the temperature inside the package 220. In one embodiment, the substrate 225 is ceramic and includes embedded traces that connect the integrated circuits 230A-D that are mounted thereon. The substrate 225 may also include multiple layers to increase the flexibility connecting traces. An integrated circuit 230A may be electrically coupled to the substrate 225 by touching conductive pads on the circuit 230A to bond wires on the surface of the substrate 225. In one embodiment, the active cooler 235 includes two dissimilar metals 240, 245 forming a peltier-type cooler at a junction traversed by electrical current. The cold side 240 of the cooler is in contact with the package 220. The hot side 245 of the cooler is attached to a fan 250 to assist in moving the generated heat away from the package 220. The movement of heat from the integrated circuits 230A-D to the cold side 240 of the cooler may occur by radiation. In particular embodiments, such transfer can be increased by increasing the density of gas inside the package 220 (for example by including an inert gas rather than evacuating) or by lowering the reflectivity of surfaces inside the package. In another aspect of the invention, compliant, thermally-conductive materials can be used to assist transfer as discussed in more detail in FIGS. 4-8.

The integrated circuits 230A-D are thermally coupled to an active cooler and, therefore, may be operating at a temperature below the ambient temperature of the downhole tool. In one embodiment, the maximum operating temperatures of integrated circuits 230A-D are each below the ambient temperature, but above the local temperature maintained in the package 220. For example, integrated circuits 230A-D may include one or more memories that have a maximum operating temperature below the ambient temperature of the downhole location. The memories may be constructed of densely packed circuitry that produces heat when operating and uses bulk CMOS as a material. Densely packed memories may be useful in storing raw waveforms received from the sensor 205 of the downhole tool 150.

Figure 3:
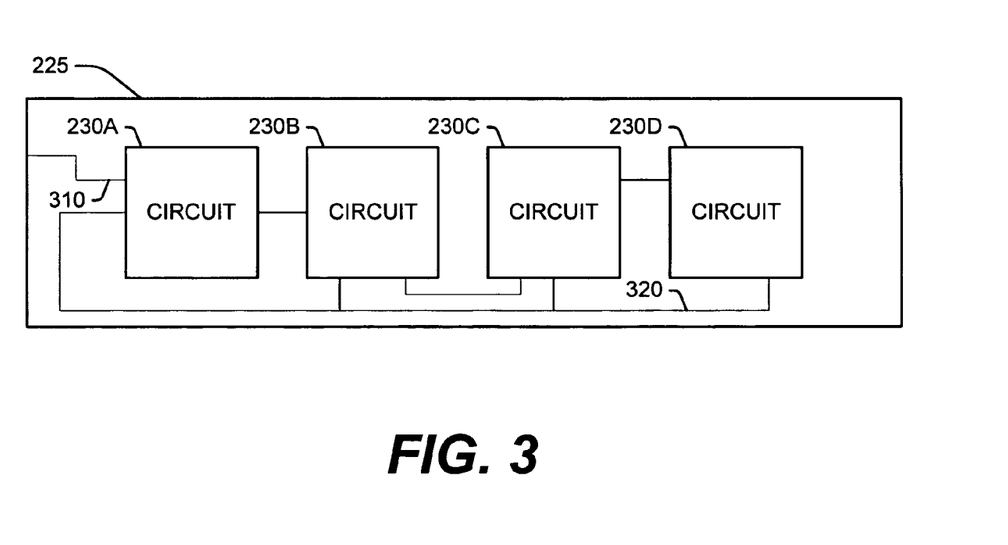
FIG. 3 is a top view of the actively cooled substrate component of the downhole tool.

FIG. 3 is a top view of the actively cooled substrate 225 of the downhole tool 150. Each of the circuits 230A-D may be connected to each other by bond wires 320. Bond wires may also be used to connect the circuits 230A-D to the substrate 225 and bond wires 310 may connect off the substrate as well. Bond wires 310, 320 can be delicate and it is important not to damage them because the circuits 230A-D could stop operating as a result. Each circuit 230A-D has some bond wires at its periphery that define within them an area that is free of bond wires. In one embodiment, pressure can be exerted in this area that is greater than the pressure that can be exerted against the bond wires without breaking them. For example, pressure can be exerted by compressing materials between the circuit dies and the lid of a package as discussed in FIGS. 4-8.

Figure 4:
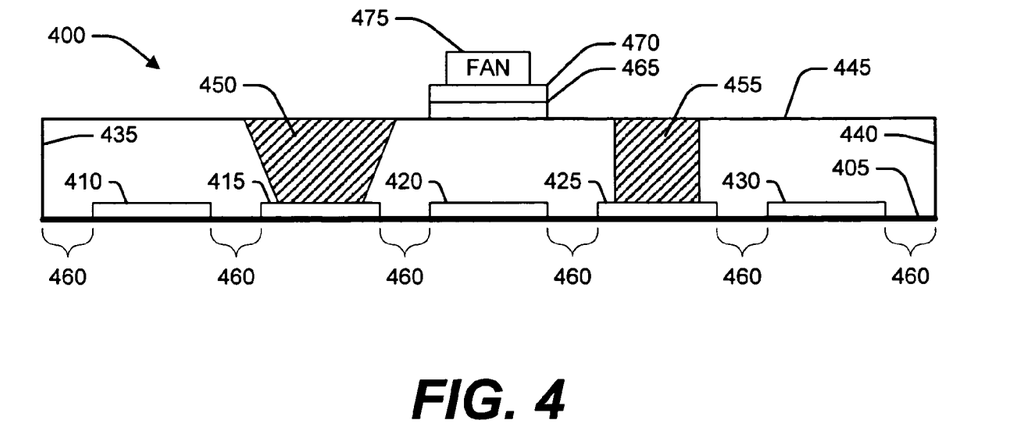
FIG. 4 is a side view of one embodiment of an electronic device package.

FIG. 4 depicts a side view of one embodiment of an electronic device package 400. Substrate 405, together with sides 435, 440 and lid 445 define, together with two additional sides not seen in this view, a volume sealed within the package 400. In another embodiment, the substrate 405 can be contained in a volume define in part by the sides 435, 440 and lid 445. Five integrated circuits 410, 415, 420, 425, and 430 are mounted on the substrate 405. In one embodiment, integrated circuits 410, 420, and 430 are capable of operating at a higher temperature than integrated circuits 415 and 425 and all of the circuits are coupled together through traces in the substrate 405. Integrated circuits 415 and 425 are thermally coupled to an active cooler by compressed pieces of compliant and thermally conductive material 450 and 455, respectively, and the lid 445 of the package. The active cooler includes a peltier-type cooler 465, 470 and/or a fan 475. In another embodiment, the lid 445 is thermally coupled to a passive or active cooler by a heat pipe, which can be filled with a working fluid. In another embodiment, the lid 445 includes channels through which fluid can be directed. Heat transferred to the fluid can then be carried away from the lid.

One example of a compliant and thermally conductive material is expanded polytetraflouroethylene matrix containing boron nitride particles. One such material is commercially available under the trade name Polarchip. As discussed with respect to FIG. 3, areas around the dies 460 may contain bonding wires that are susceptible to damage from pressure and an area free of bonding wires is defined within those wires for each circuit. In one embodiment, the surface of the compliant and thermally conductive material 450 that is in contact with the die of the circuit 415 is smaller in cross-section than the area free of bonding wires. In that embodiment, the cross-section of the material 450 away from the die 415, for example at the surface touching the lid 445, may include sufficient area to cover the bonding wires areas 460. In another embodiment, the material 455 has the same cross-sectional area from the die 425 to the lid 445. The sealed volume formed by the substrate 405, sides 435 and 440, and the lid 445 may be evacuated or filled with an inert gas.

Figure 5:
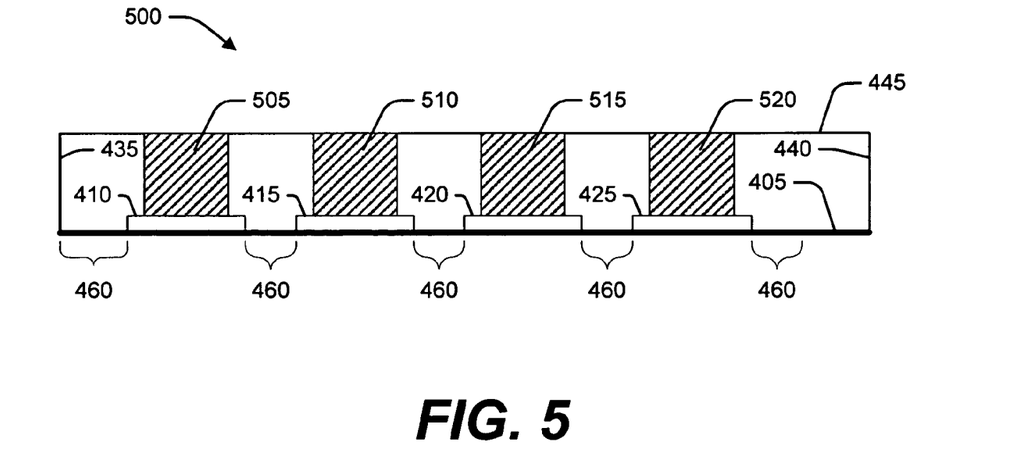
FIG. 5 is a side view of one embodiment of an electronic device package.

FIG. 5 depicts a side view of one embodiment of an electronic device package 500. The package includes four integrated circuits 410, 415, 420, 425 mounted on a substrate 405 and coupled thereto with bonding wires in areas 460. Substrate 405, together with sides 435, 440 and lid 445 define, together with two additional sides not seen in this view, a volume sealed within the package 400. In another embodiment, the substrate 405 can be contained in a volume define in part by the sides 435, 440 and lid 445. Each of the circuits 410, 415, 420, 425 is thermally coupled to the lid 445 by a piece of compliant and thermally conductive material 505, 510, 515, 520 compressed between the circuit and the lid 445. The heat produced by the circuits 410, 415, 420, 425 is conducted away from the die into the lid where it is dispersed into the environment.

Figure 6:
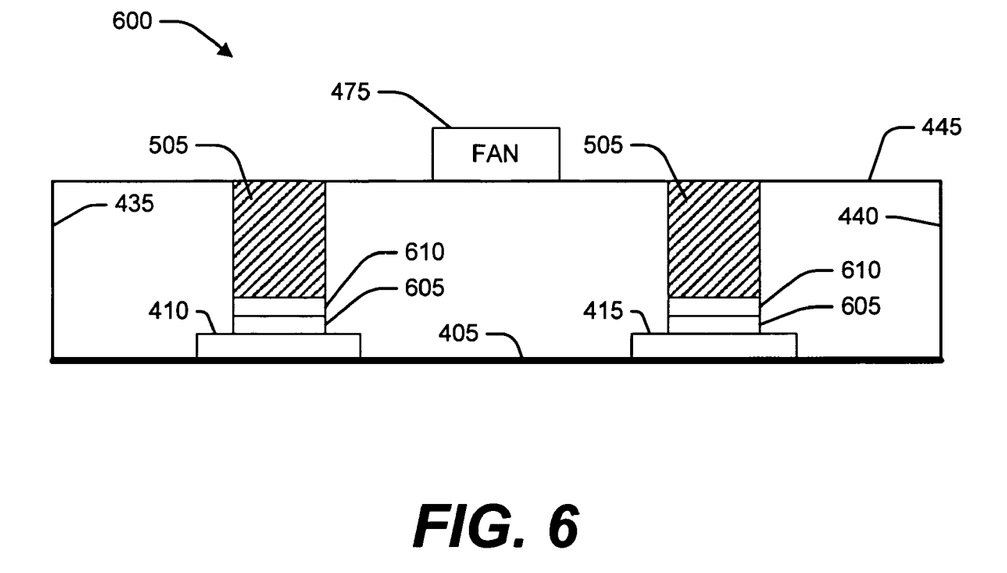
FIG. 6 is a side view of one embodiment of an electronic device package.

FIG. 6 depicts a side view of one embodiment of an electronic device package 600. Two circuits 410 and 415 are mounted on the substrate 405 which defines a sealed volume with the sides 435, 440, lid 445, and two additional sides that are not shown. The cold side 605 of a peltier-type active cooler is coupled to each die with the hot side 610 thermally coupled to the lid 445 by a piece of compliant and thermally conductive material 505 compressed between each hot side 610 and the lid 445. In this embodiment, the integrated circuits 410 and 415 are actively cooled and the heat produced by the peltier-type cooler is conducted out of the package. A fan 475 may be including to assist in dispersing heat conducted to the lid 445 from the hot sides 610 of the peltier-type devices. In other embodiments, active coolers other than peltier-type coolers can be used inside the package with excess heat conducted to the lid 445 using pieces of compliant and thermally conductive material 505. Additional integrated circuits that do not require active cooling can be added to the substrate 405 and thermally coupled to the lid 445 without an active cooler.

Figure 7:
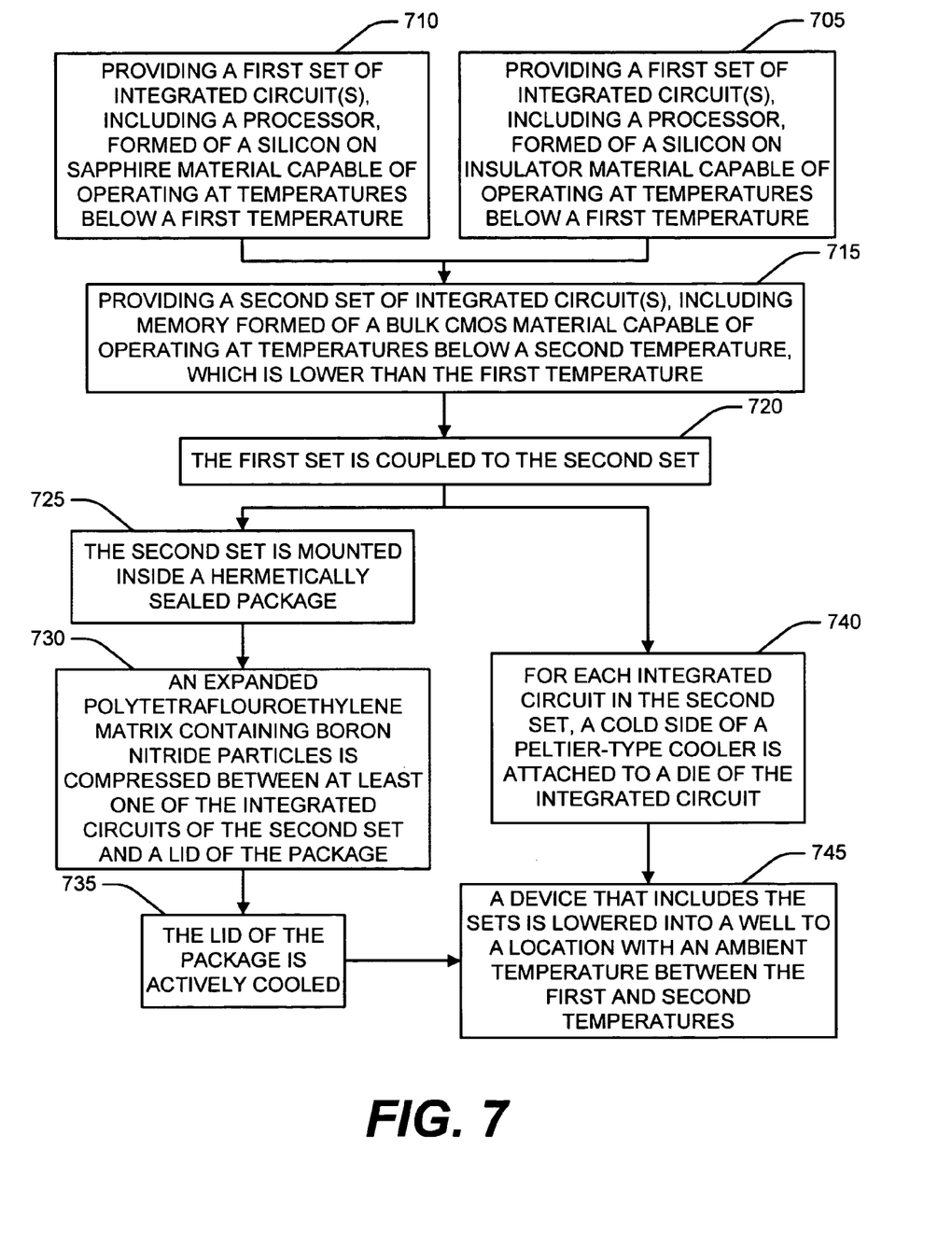
FIG. 7 is a flow chart of one embodiment of a method for high temperature operation of electronics.

FIG. 7 is a flow chart of one embodiment of a method for high temperature operation of electronics. In the first step, a first set of one or more integrated circuits, which include a processor, are formed of either silicon on insulator 705 or silicon on sapphire 710 material capable of operating at temperatures below a first temperature. In the second step 715, a second set of one or more integrated circuits, which include memory, are formed of bulk CMOS material capable of operating at temperatures below a second temperature, which is lower than the first temperature. The first and second temperatures are operating temperatures and may be based on the material and the circuit density, as well as other factors. In the third step 720, the first set is coupled to the second set. For example, the first set may process information received from a sensor and the second set may store the processed information. In one embodiment 740, the die of each circuit in the second set is attached to the cold side of a peltier-type cooler. In another embodiment, the next step 725 includes mounting the second set inside a hermetically sealed package. In the next step 730, an expanded polytetraflouroethylene matrix containing boron nitride particles is compressed between at least one of the integrated circuits of the second set and a lid of the package. In the next step 735, the lid of the package is actively cooled. In the last step 745 of one embodiment, the sets are included in a device and lowered into a well to a location with an ambient temperature between the first and second temperatures.

Figure 8:
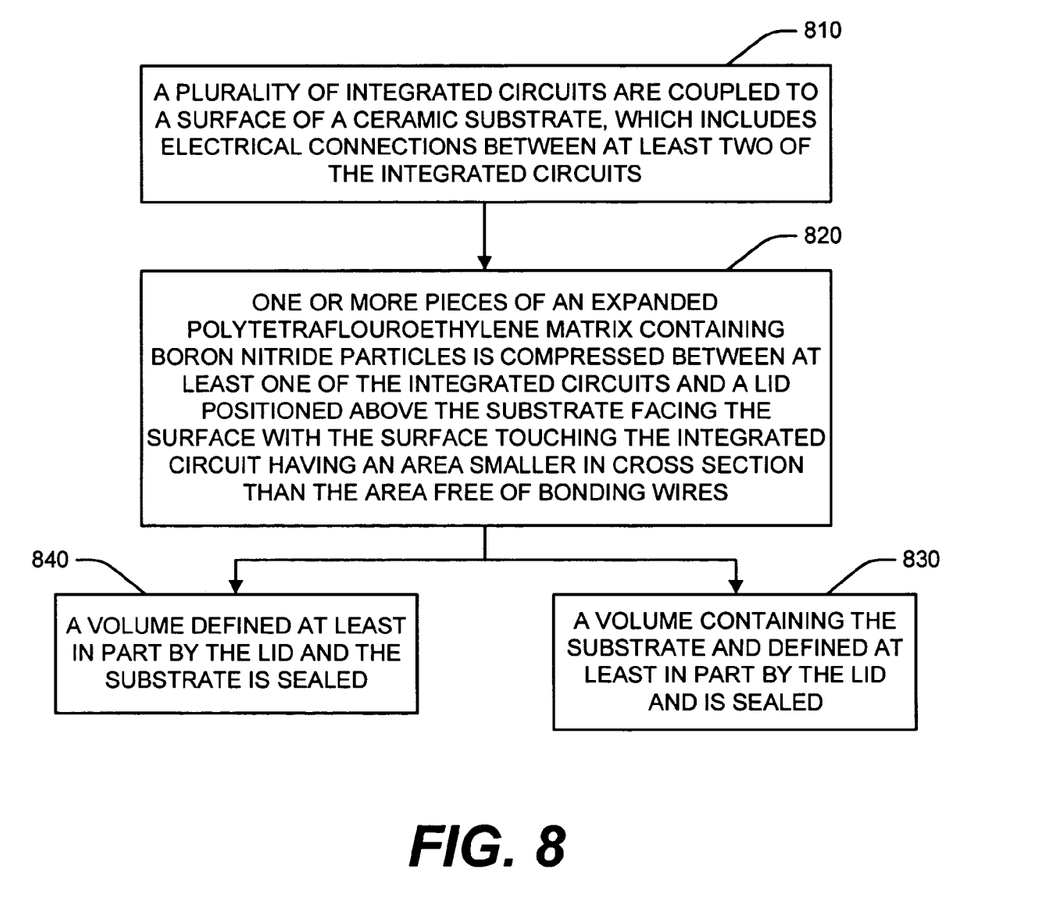
FIG. 8 is a flow chart of one embodiment of a method for high temperature operation of electronics.

FIG. 8 is a flow chart of one embodiment of a method for high temperature operation of electronics. In the first step 810, a plurality of integrated circuits are coupled to a surface of a ceramic substrate, which includes electrical connections between at least two of the integrated circuits. In the next step 820, one or more pieces of an expanded polytetraflouroethylene matrix containing boron nitride particles is compressed between at least one of the integrated circuits and a lid positioned above the substrate facing the surface with the surface of the material touching the integrated circuit having an area smaller in cross section than the area free of bonding wires. In the last step 840 of one embodiment, a volume defined at least in part by the lid and substrate is sealed. In the last step 830 of another embodiment, a volume containing the substrate and defined at least in part by the lid is sealed.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method of operating an electronic device, comprising:
providing in the device, a first set of one or more integrated circuits capable of operating at temperatures below a first temperature;
providing in the device, a second set of one or more integrated circuits capable of operating at temperatures below a second temperature, where the second temperature is lower than the first temperature;
coupling the second set of circuits to the first set of circuits;
thermally coupling one or more active coolers to the second set of integrated circuits; and
locating the device in an ambient temperature between the first temperature and the second temperature.

2. The method of claim 1 where the first set of circuits are formed of a silicon on sapphire material.

3. The method of claim 1 where the first set of circuits are formed of a silicon on insulator material.

4. The method of claim 1 where thermally coupling one or more active coolers to the second set of integrated circuits includes:
for each integrated circuit in the second set, attaching a cold side of a peltier-type cooler to a die of the integrated circuit.

5. The method of claim 1 where thermally coupling one or more active coolers to the second set of integrated circuits includes:
mounting the second set of integrated circuits inside a hermetically sealed package;
compressing one or more pieces of compliant and thermally conductive material between at least one of the integrated circuits and a lid of the package; and
actively cooling the lid of the package.

6. The method of claim 5, where the compliant and thermally conductive material is an expanded polytetraflouroethylene matrix containing boron nitride particles.

7. The method of claim 1 where the second set of integrated circuits include memory.

8. The method of claim 1 where the first set of integrated circuits include a processor.

9. The method of claim 1 where locating the device in an ambient temperature between the first temperature and the second temperature includes lowering the device into a well.

10. The method of claim 1 where the first set of integrated circuits include sensor electronics and the second set of integrated circuits include memory configured to store measurements processed by the sensor electronics.

11. The method of claim 1 where the second set of integrated circuits are formed of a bulk CMOS material.

12. An electronic device comprising:
a first set of one or more integrated circuits formed of high temperature materials;
a second set of one or more integrated circuits formed of low temperature materials coupled to receive information from the first set; and
one or more active coolers thermally coupled to the second set of integrated circuits.

13. The device of claim 12 where the first set of circuits are formed of a silicon on sapphire material.

14. The device of claim 12 where the first set of circuits are formed of a silicon on insulator material.

15. The device of claim 12 where the active coolers include a peltier-type cooler.

16. The device of claim 12 further comprising:
a hermetically sealed package surrounding the second set of circuits;
one or more pieces of compliant and thermally conductive material compressed between at least one of the circuits in the second set and a lid of the package; and
wherein the active coolers are thermally coupled to the lid.

17. The device of claim 16 where the compliant and thermally conductive material is an expanded polytetraflouroethylene matrix containing boron nitride particles.

18. The device of claim 12 where the second set of integrated circuits include memory.

19. The device of claim 12 where the first set of integrated circuits include a processor.

20. The device of claim 12 where the device is a downhole well tool.

21. The device of claim 12 where the first set of integrated circuits include sensor electronics and the second set of integrated circuits include memory configured to store measurements processed by the sensor electronics.

22. The system of claim 12 where the second set of integrated circuits are formed of a bulk CMOS material.

* * * * *